United States Patent
Hirai et al.

(10) Patent No.: US 7,300,132 B2
(45) Date of Patent: Nov. 27, 2007

(54) PATTERN FORMING METHOD, METHOD OF MANUFACTURING ELECTRONIC APPARATUS, AND METHOD OF MANUFACTURING SUBSTRATE

(75) Inventors: Toshimitsu Hirai, Chino (JP); Shinri Sakai, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 310 days.

(21) Appl. No.: 11/207,931

(22) Filed: Aug. 22, 2005

(65) Prior Publication Data
US 2006/0055722 A1 Mar. 16, 2006

(30) Foreign Application Priority Data
Sep. 15, 2004 (JP) ............................. 2004-267874

(51) Int. Cl.
*B41J 29/393* (2006.01)
*B41J 29/38* (2006.01)
*H01L 21/00* (2006.01)
*H01L 21/20* (2006.01)

(52) U.S. Cl. .............................. 347/19; 347/5; 438/30; 438/584

(58) Field of Classification Search ................ 347/19; 358/584
See application file for complete search history.

(56) References Cited

U.S. PATENT DOCUMENTS

2005/0090029 A1* 4/2005 Yamazaki et al. .......... 438/584

FOREIGN PATENT DOCUMENTS

| JP | 2000-164635 | 6/2000 |
|----|-------------|--------|
| JP | 2003-318514 | 11/2003 |
| JP | 2004-089868 | 3/2004 |

* cited by examiner

*Primary Examiner*—Matthew Luu
*Assistant Examiner*—Jannelle M. Lebron
(74) *Attorney, Agent, or Firm*—Oliff & Berridge PLC

(57) ABSTRACT

A pattern forming method is a method of forming a pattern on a surface of an object by using a droplet discharge device that discharges a first droplet and a second droplet from nozzles. The pattern forming method includes when coordinates on the object surface are represented by integers m and n, and two integers other than zero are represented by i and j, forming a bank pattern that borders a pattern formation region such that a range of a first projection image of the first droplet when a landable position with a coordinate (m, n) substantially coincides with the center of the first projection image and a range of a second projection image of the second droplet when a landable position with a coordinate (m+i, n+j) substantially coincides with the center of the second projection image fall within the pattern formation region on the surface of the object; and forming a pattern that covers the pattern formation region by discharging the first droplet to the landable position with the coordinate (m, n) and by discharging the second droplet to the landable position with the coordinate (m+i, n+j). Further, the distance between the landable position with the coordinate (m, n) and the landable position with the coordinate (m+i, n+j) is determined such that the first droplet and the second droplet flow into each other after the first and second droplets spread on the pattern formation region.

13 Claims, 12 Drawing Sheets

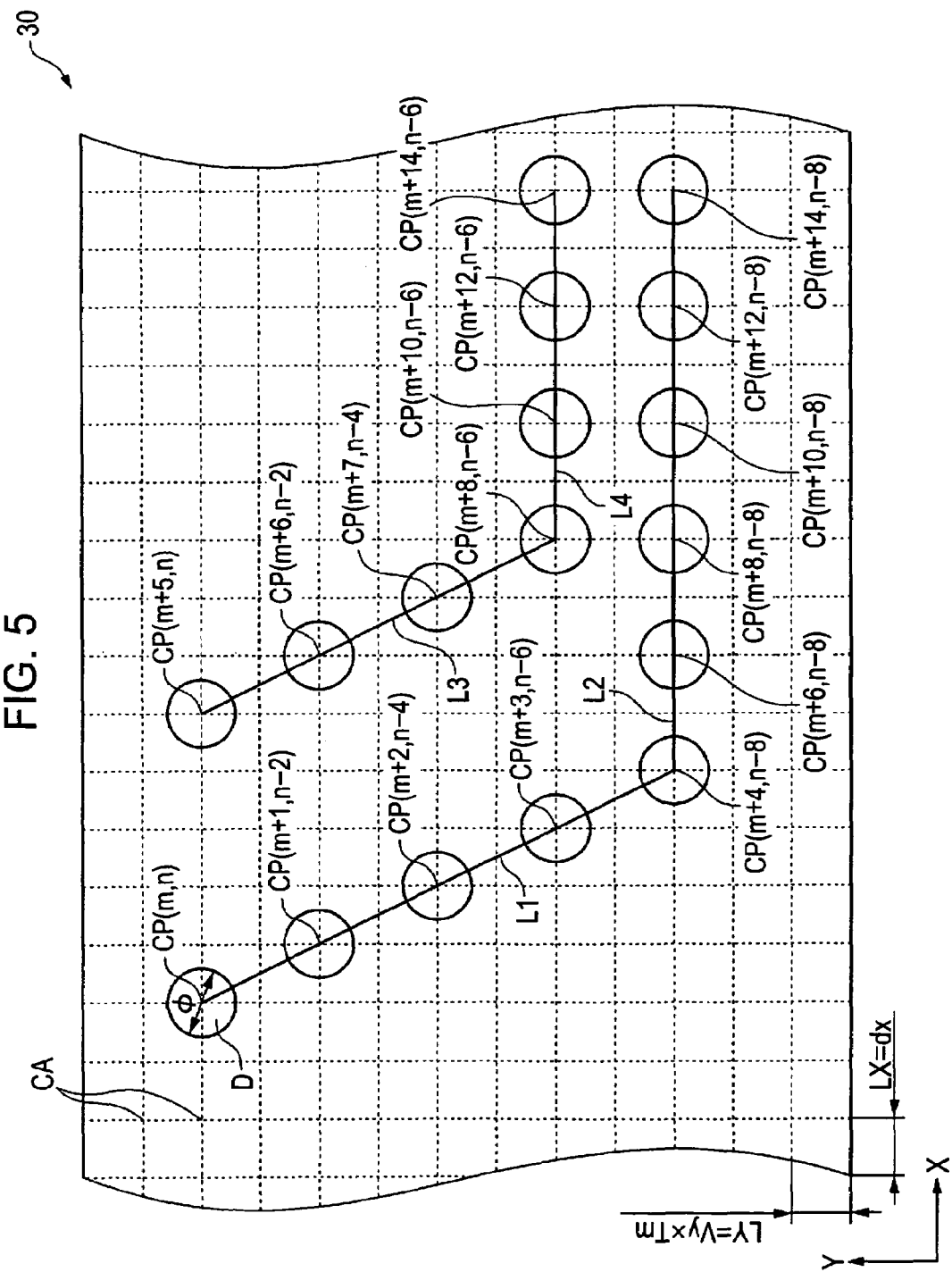

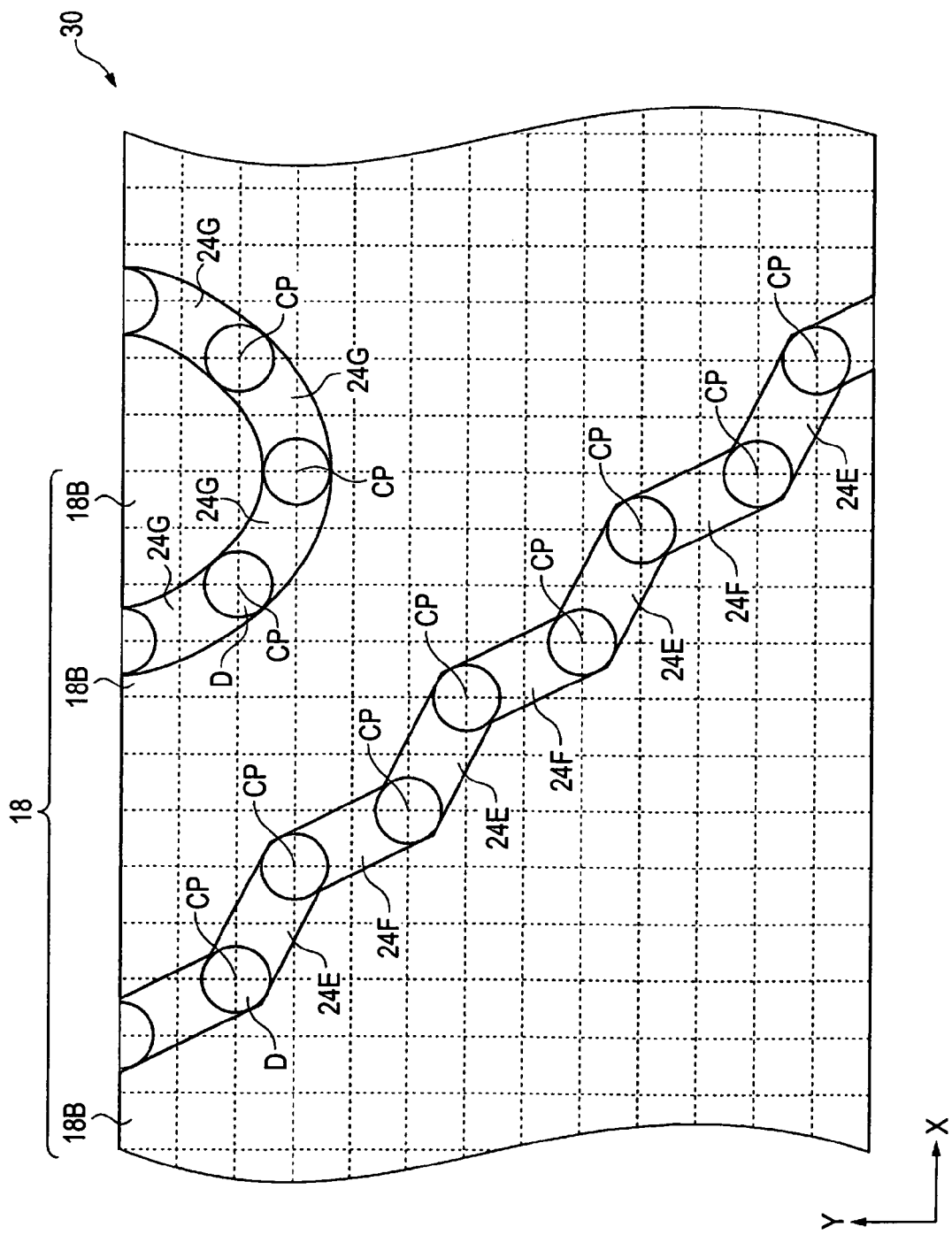

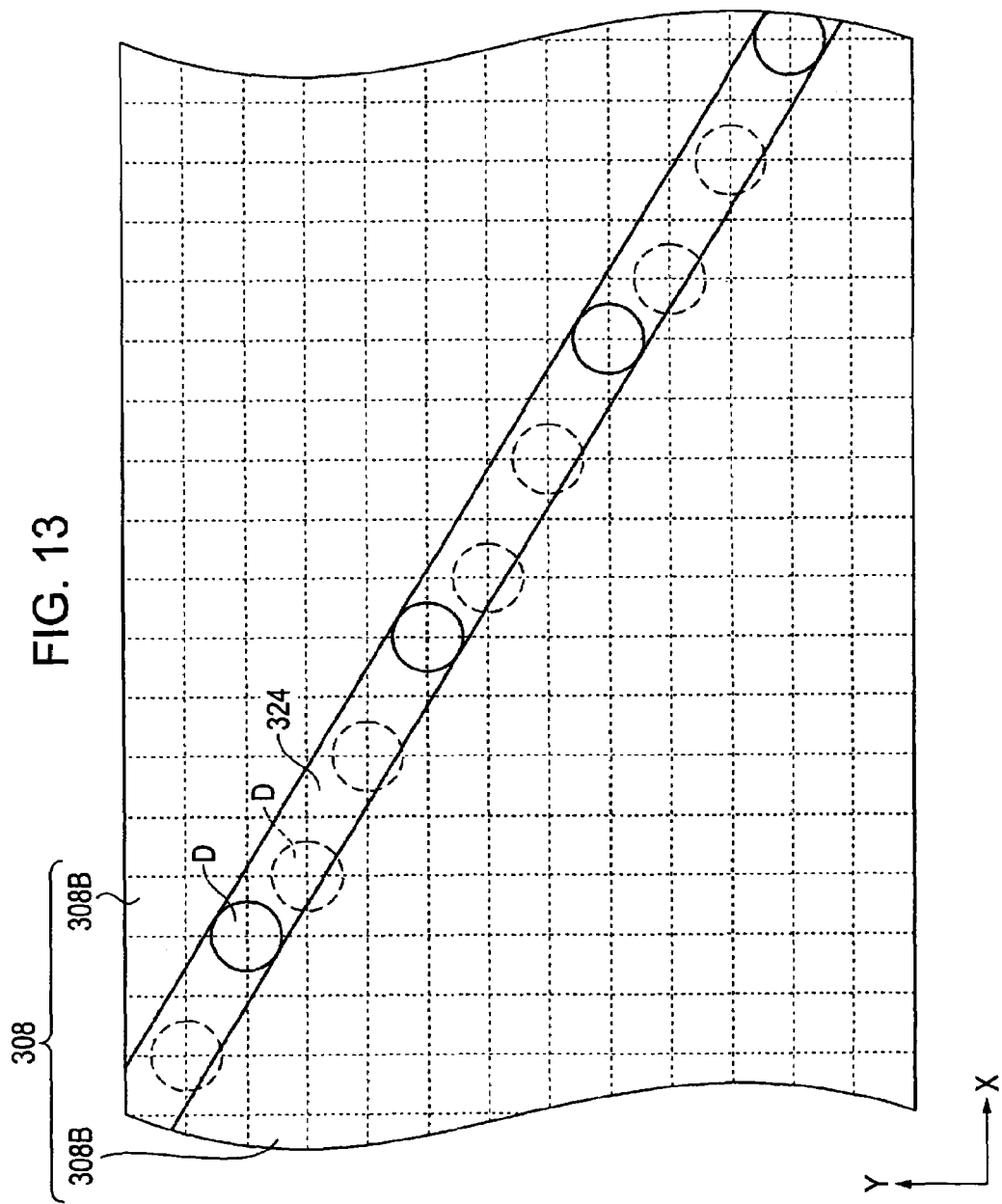

PATTERN FORMING METHOD, METHOD OF MANUFACTURING ELECTRONIC APPARATUS, AND METHOD OF MANUFACTURING SUBSTRATE

This application claims the benefit of Japanese Patent Application No. 2004-267874, filed Sep. 15, 2004. The entire disclosure of the prior application is hereby incorporated by reference in its entirety.

BACKGROUND OF THE INVENTION

1. Technical Field

The present invention relates to a pattern forming method using a droplet discharge device, and more particularly, to a pattern forming method suitable for forming a wiring pattern in an electronic apparatus, and to a method of manufacturing a substrate provided with the wiring pattern.

2. Related Art

Japanese Unexamined Patent Application Publication No. 2003-318514 discloses a method of forming a metallic wiring pattern, which forms an angle of 45 degrees with respect to a reference line of a grid, using a droplet discharge device.

As shown in FIG. 13, in a case where droplets D are discharged to a portion 324 bordered by a bank pattern 308 or a lyophobic pattern to form a pattern, some of the discharged droplets D collide against the bank pattern 308 (or the lyophobic pattern). As a result, residual debris may be generated on the bank pattern 308 or the lyophobic pattern. In addition, the bank pattern 308 shown in FIG. 13 is composed of two banks 308B.

SUMMARY

An advantage of the invention is that it provides a bank pattern or a lyophobic pattern corresponding to a thin film pattern so that the thin film pattern can be formed well in a portion that extends obliquely with respect to a scanning direction of a droplet discharge device.

According to one aspect of the invention, a pattern forming method is a method of forming a pattern on a surface of an object by using a droplet discharge device that discharges a first droplet and a second droplet from nozzles. The pattern forming method includes (A) when coordinates on the object surface are represented by integers m and n, and two integers other than zero are represented by i and j, forming a bank pattern that borders a pattern formation region such that a range of a first projection image of the first droplet when a landable position with a coordinate (m, n) substantially coincides with the center of the first projection image and a range of a second projection image of the second droplet when a landable position with a coordinate (m+i, n+j) substantially coincides with the center of the second projection image fall within the pattern formation region on the surface of the object; and (B) forming a pattern that covers the pattern formation region by discharging the first droplet to the landable position with the coordinate (m, n) and by discharging the second droplet to the landable position with the coordinate (m+i, n+j). Further, the distance between the landable position with the coordinate (m, n) and the landable position with the coordinate (m+i, n+j) is determined such that the first droplet and the second droplet flow into each other after the first and second droplets spread on the pattern formation region.

One of the effects obtained by the above construction is to provide a pattern having a certain shape without causing droplets from the droplet discharge device to touch the bank pattern.

Preferably, (A) forming the bank pattern that borders the pattern formation region includes forming the bank pattern such that two linear or curved pattern formation regions are obtained. Also, the two pattern formation regions are parallel to each other.

One of the effects obtained by the above construction is that two patterns parallel to each other can be formed.

Preferably, (A) forming the bank pattern that borders the pattern formation region includes forming the bank pattern such that two linear or curved pattern formation regions are obtained. Also, the two pattern formation regions are not parallel to each other.

One of the effects obtained by the above construction is that two patterns, which are not parallel to each other, can be formed.

Preferably, the two linear pattern formation regions are connected to each other. Here, one of the two linear pattern formation regions is parallel to a first direction. Further, the other of the two linear pattern formation regions forms an angle that is greater than 0° and smaller than 90° with respect to the first direction. Also, (B) forming the pattern that covers the pattern formation region includes discharging a droplet with a first volume to the landable position in the one pattern formation region, and discharging a droplet with a second volume smaller than the first volume to the landable position in the other pattern formation region.

One of the effects obtained by the above construction is that a droplet with a first volume can be discharged to the pattern formation region which forms the above angle with respect to the first direction and a droplet with a second volume smaller than the first volume can be discharged toward the pattern formation region parallel to the first direction.

Preferably, the droplet discharge device is adapted to selectively discharge a plurality of droplets from the nozzles to a plurality of landable positions by relatively moving the nozzles in a first direction and a second direction that are different from each other. Here, the plurality of landable positions constitutes a grid parallel to the first direction and the second direction. Further, a first pitch between the plurality of landable positions along the first direction is determined on the basis of a relative moving speed of the nozzles in the first direction and a minimum discharge period corresponding to a material in a liquid phase. Moreover, a second pitch between the plurality of landable positions along the second direction is determined by a relative moving speed of the nozzles in the second direction.

One of the effects obtained by the above construction is that droplets of a material in a liquid phase can be discharged in a minimum discharge period corresponding the material in a liquid phase, thereby forming a pattern.

Preferably, the material in a liquid phase is a conductive material.

One of the effects obtained by the above construction is that a wiring pattern extending obliquely with respect to a relative moving direction of the nozzles can be formed without causing droplets to touch the bank pattern.

According to still another aspect of the invention, a method of manufacturing an electronic apparatus includes the above pattern forming method.

One of the effects obtained by the above construction is that a wiring pattern of an electronic apparatus can be formed using the droplet discharge device.

The invention can be implemented in various aspects other than the above aspects. For example, the invention can be implemented in an aspect of forming a lyophobic patter other than forming the bank pattern in (A).

According to further still another aspect of the invention, a substrate manufacturing method is a method of manufacturing a substrate including a pattern formation region to which a first droplet and a second droplet is imparted by using a droplet discharge device that relatively moves nozzles in a first direction and a second direction different from each other to discharges the first droplet and the second droplet from the nozzles. The substrate manufacturing method includes, when coordinates on a surface of the substrate are represented by integers m and n, and two integers other than zero are represented by i and j, forming a bank pattern that borders a pattern formation region such that a range of a first projection image of the first droplet when a position with a coordinate (m, n) substantially coincides with the center of the first projection image and a range of a second projection image of the second droplet when a position with a coordinate (m+i, n+j) substantially coincides with the center of the second projection image fall within the pattern formation region. Also, the distance between the position with the coordinate (m, n) and the position with the coordinate (m+i, n+j) is determined such that the first droplet and the second droplet flow into each other after the first and second droplets spread on the pattern formation region. In addition, forming the bank pattern may be substituted with forming a lyophobic pattern.

The substrate manufactured by the above manufacturing method can be provided with a pattern having a certain shape without causing droplets from the droplet discharge device to touch the bank pattern.

BRIEF DESCRIPTION OF THE DRAWINGS

The invention will be described with reference to the accompanying drawings, wherein like numbers reference like elements, and wherein:

FIG. 5 is a conceptual diagram showing discharge data according to the present embodiment;

FIG. 11 is a schematic view showing a modified example of the pattern formation region according to the present embodiment;

FIG. 13 is a schematic view showing a case in which a linear portion bordered by a bank pattern and a straight line connecting two adjacent landable positions to each other are not parallel to each other.

DESCRIPTION OF THE EMBODIMENTS (A. Overall Construction of Device Manufacturing Apparatus)

Figure 1:
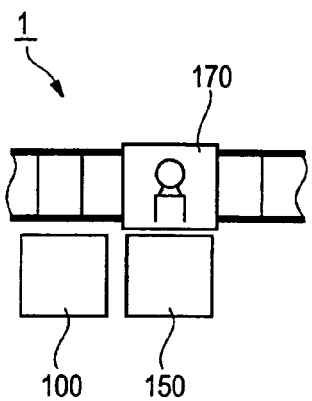
FIG. 1 is a schematic view of a device manufacturing apparatus according to the present embodiment.
Figure 2:
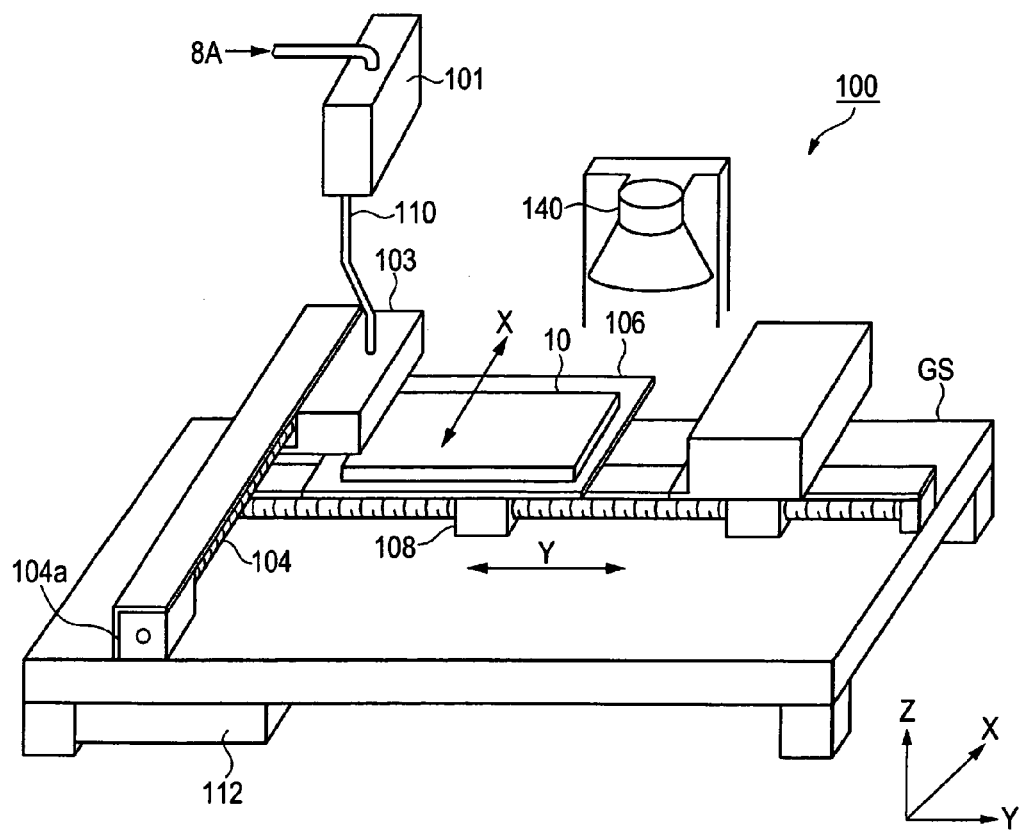
FIG. 2 is a schematic view of a droplet discharge device according to the present embodiment.

A device manufacturing apparatus according to the invention will be described below. The device manufacturing apparatus 1 shown in FIG. 1 is a part of an apparatus for manufacturing a liquid crystal display device. Further, the device manufacturing apparatus 1 includes a droplet discharge device 100, a clean oven 150 and a carrier device 170. The droplet discharge device 100 is adapted to form a conductive material layer on a substrate 10 by discharging a droplet of a conductive material on the substrate 10 (FIG. 2). Meanwhile, the clean oven 150 serves to activate the conductive material layer formed by the droplet discharge device 100 to form a conductive layer.

The carrier device 170 includes a fork part, a driving unit that moves the fork part up and down, and a free-running part. Further, the carrier device 170 carries the substrate 10 so that the substrate 10 can undergo the processing by the droplet discharge device 100 and the clean oven 150 in this order. Hereinafter, the structure and functions of the droplet discharge device 100 will be described in detail.

(B. Configuration of Droplet Discharge Device)

As shown in FIG. 2, the droplet discharge device 100 is a so-called inkjet device. Specifically, the droplet discharge device 100 includes a tank 101 that contains a conductive material 8A, a tube 110, a ground stage GS, a discharge head unit 103, a stage 106, a first position control unit 104, a second position control unit 108, a control system 112, a support 104a and a heater 140.

The discharge head unit 103 holds a head 114 (FIG. 3). The head 114 discharges droplets of the conductive material 8A according to a driving signal from the control system 112. In addition, the head 114 in the discharge head unit 103 is coupled to the tank 101 by the tube 110. For this reason, the conductive material 8A is supplied from the tank 101 to the head 114.

The stage 106 provides a flat surface for fixing the substrate 10. The flat surface of the stage 106 is parallel to the X-axis direction and the Y-axis direction. The stage 106 also serves to fix the position of the substrate 10 using suction power.

The first position control unit 104 is fixed to a position of a predetermined height from the ground stage GS by means of the support 104a. The first position control unit 104 functions to move the discharge head unit 103 in the X-axis direction and in the Z-axis direction orthogonal to the X-axis direction, according to a signal from the control system 112. The first position control unit 104 also serves to rotate the discharge head unit 103 around an axis parallel to the Z axis. In this case, in the present embodiment, the Z-axis direction is a direction parallel to a vertical direction (i.e., a direction of gravitational acceleration).

The second position control unit 108 moves the stage 106 in the Y-axis direction on the ground stage GS according to a signal from the control system 112. In this case, the Y-axis direction is a direction orthogonal to both the X-axis direction and the Z-axis direction.

The construction of the first position control unit 104 having the above functions and the construction of the second position control unit 108 having the above functions can be implemented using a known XY robot using a linear motor and a servo motor. Thus, detailed description thereof will be omitted herein. In addition, in the present specification, the first position control unit 104 and the second position control unit 108 will also be referred to as a "robot" or "scanning unit", respectively.

Further, in the present embodiment, the X-axis direction, the Y-axis direction and the Z-axis direction coincide with the direction in which one of the discharge head unit 103 and the stage 106 moves relative to the other. Among them, the X-axis direction will also be referred to as a "non-scanning direction". The Y-axis direction will also be referred to as a "scanning direction". Further, a imaginary origin of the XYZ coordinate system that defines the X-axis direction, the Y-axis direction and the Z-axis direction is fixed to a reference portion of the droplet discharge device 100. Moreover, in the present specification, X coordinates, Y coordinates and Z coordinates are coordinates in this XYZ coordinate system. In addition, the imaginary origin may be fixed to the stage 106 as well as the reference portion, and may also be fixed to the discharge head unit 103.

As described above, the discharge head unit 103 moves in the X-axis direction by means of the first position control unit 104. Further, the substrate 10 moves in the Y-axis direction together with the stage 106 by means of the second position control unit 108. As a result, the position of the head 114 changes relative to the substrate 10. More specifically, this operation causes the discharge head unit 103, the head 114 or the nozzles 118 (FIG. 3) to relatively move in the X-axis direction and the Y-axis direction, i.e., perform scanning in a relative way, while maintaining a predetermined distance from the substrate 10 in the Z-axis direction. The term "relative moving" or "relative scanning" means that one of a first side where the droplets of the conductive material 8A are discharged and a second side (substrate 10) where the droplets land from the first side moves relative to the other. Further, in the present specification, the case in which only the substrate 10 or the stage 106 moves and the nozzles 118 remains stationary is also referred to as "the nozzles 118 moves relatively".

The control system 112 is adapted to receive discharge data from an external information processing unit. The control system 112 stores the received discharge data in an internal storage unit 202 (FIG. 4), and controls the first position control unit 104, the second position control unit 108 and the head 114 according to the stored discharge data. In this case, the term "discharge data" refers to data indicating a relative position where droplets of the conductive material 8A are to be discharged. In the present embodiment, the discharge data has a data format of bit map data.

Through the above-described construction, the droplet discharge device 100 can move the nozzles 118 (FIG. 3) of the head 114 relative to the substrate 10 according to the discharge data, and can control the nozzles 118 to discharge droplets of the conductive material 8A toward set landable position from the nozzles 118. In addition, a combination of relative motion of the head 114 by the droplet discharge device 100, and discharge of droplets of the conductive material 8A from the nozzles 118 is also referred to as "coating scanning" or "discharge scanning".

In the present specification, a portion in which droplets of the conductive material 8A have landed will be referred to as a "target discharge portion". Further, a portion that gets wet where the landed droplets spread will be referred to as a "target coating portion". Both the "target discharge portion" and the "target coating portion" are portions, which are formed by performing a surface reforming treatment on an underlying object so that the conductive material 8A has a desired contact angle. Even if the surface reforming treatment is not performed, in a case where a surface of the underlying object has a desired lyophobic property or a lyophilic property (i.e., the landed conductive material 8A has a preferred contact angle on the surface of the underlying object) to the conductive material 8A, the surface itself of the underlying object may be the "target discharge portion" or the "target coating portion". In addition, in the present specification, the "target discharge portion" will also be referred to as a "target" or "receiving portion". A "pattern formation region" to be described below includes the "target discharge portion" and the "target coating portion".

Here, the conductive material 8A is a kind of "material in a liquid phase". The term "material in a liquid phase" refers to a material with viscosity, which can be discharged as a droplet from the nozzles 118 of the head 114. In this case, the material in a liquid phase can be aqueous or oil-like. The material in a liquid phase can include any materials if they have flowability (viscosity) that can be discharged from the nozzle 118, and any materials that are fluid even if they contain a solid material. It is preferred that the material in a liquid phase has the viscosity ranging from 1 mPa·s to 50 mPa·s. If the viscosity is 1 mPa·s or higher, the circumference of the nozzles 118 is hardly contaminated with the material in a liquid phase when the material in a liquid phase is discharged as a droplet. Meanwhile, if the viscosity is 50 mPa·s or lower, the droplet can be discharged more smoothly because the clogging frequency of the nozzle 118 is minimal.

The conductive material 8A contains a dispersion medium, and minute conductive particles dispersed by the dispersion medium. The grain size of the minute conductive particles is preferably in a range of 1 nm to 1.0 μm. If the grain size is below 1.0 μm, there is a low possibility that the nozzles 118 (FIG. 3) of the head 114 may be clogged. Meanwhile, if the grain size is over 1 nm, the volume ratio of a coating agent to the minute conductive particles becomes proper. Thus, the ratio of an organic substance in a film obtained becomes adequate.

The minute conductive particles according to the present embodiment are silver particles having a mean particle diameter of about 10 nm. In addition, particles having a mean particle diameter from about 1 nm to several hundreds of nanometers are referred to as "nano particles". According to this method, the conductive material in the present embodiment contains nano particles of silver.

(C. Head)

Figure 3A:
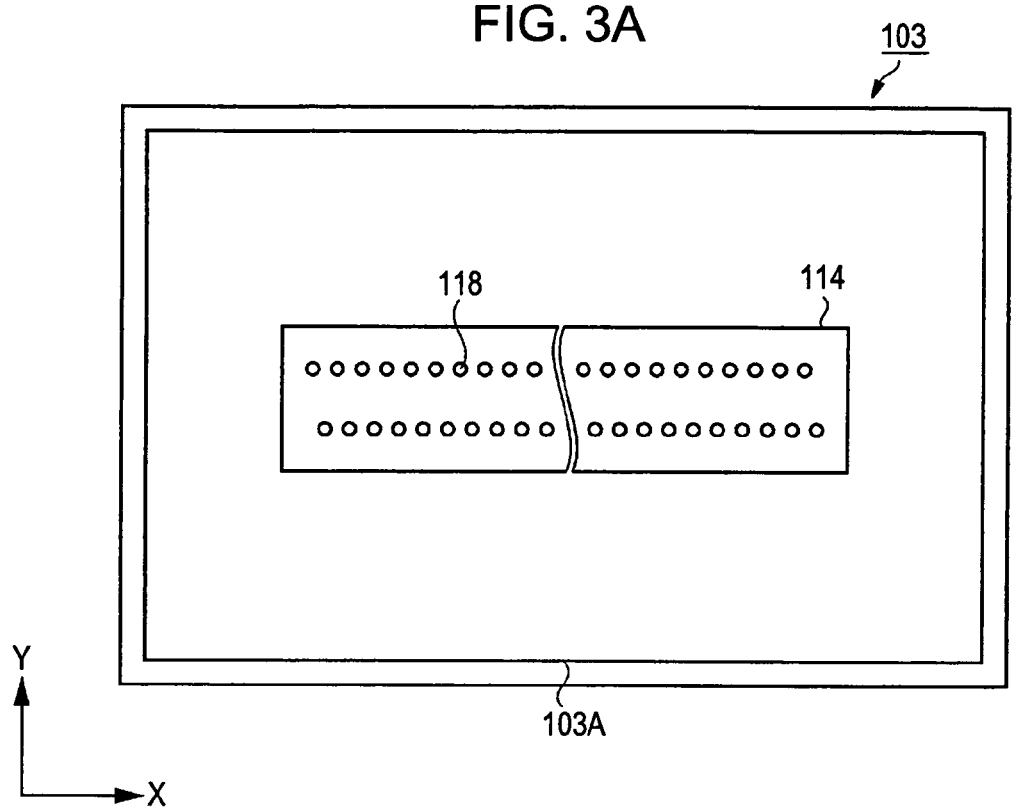
FIG. 3A is a schematic view showing a bottom of a head in a discharge head unit according to the present embodiment.
Figure 3B:
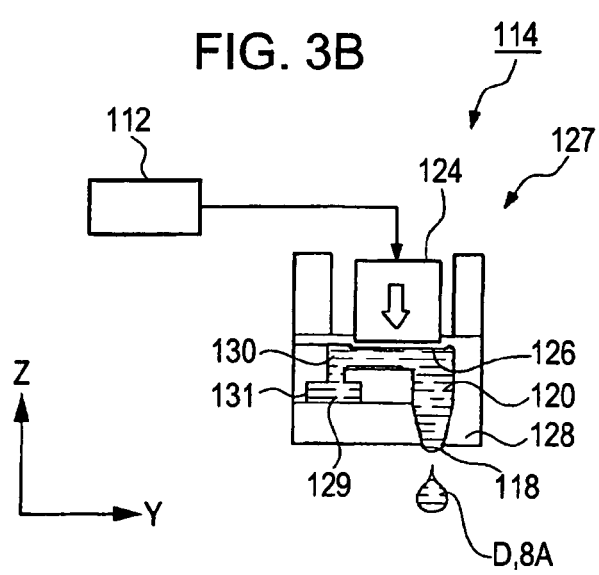
FIG. 3B is a schematic view showing one discharge portion in the head.

The head 114 will now be described in detail. As shown in FIG. 3A, the head 114 is an inkjet head having a plurality of nozzles 118. Also, the head 114 is fixed by a carriage 103A in the discharge head unit 103. As shown in FIG. 3B, the head 114 includes a vibration plate 126, and a nozzle plate 128 that defines the apertures of the nozzles 118. Further, a liquid reservoir 129 is located between the vibration plate 126 and the nozzle plate 128. The liquid reservoir 129 is always filled with the conductive material 8A supplied from an external tank (not shown) through a hole 131.

Further, a plurality of partition walls is disposed between the vibration plate 126 and the nozzle plate 128. Furthermore, a portion surrounded by the vibration plate 126, the nozzle plate 128 and a pair of the partition walls is a cavity 120. Since the cavity 120 is formed corresponding to each of the nozzles 118, the number of cavities 120 is the same as the number of nozzles 118. The cavity 120 is supplied with the conductive material 8A from the liquid reservoir 129 through a supply port 130 disposed between the pair of partition walls. In addition, in the present embodiment, the diameter of the nozzles 118 is about 27 μm.

Further, each of the oscillators 124 is disposed on the vibration plate 126 corresponding to each of the cavities 120. Each of the oscillators 124 includes a piezoelectric element, and a pair of electrodes with the piezoelectric element therebetween. If the control system 112 applies a driving voltage between a pair of the electrodes, a droplet D of the conductive material 8A is discharged from a corresponding nozzle 118. In this case, the volume of the material discharged from the nozzle 118 can vary between 0 pl and 42 pl (pico liter). Further, the volume of the droplet D can be changed by varying a waveform of a driving voltage (a so-called variable dot technology). In addition, the shape of the nozzles 118 can be adjusted such that droplets D of the conductive material 8A can be discharged from the nozzles 118 in the Z-axis direction.

In the present specification, a portion which includes one nozzle 118, the cavity 120 corresponding to the nozzle 118, and the oscillator 124 corresponding to the cavity 120 will also be referred to as a "discharge unit 127". According to this reference, one head 114 has the discharge units 127 whose number is the same as that of the nozzles 118. The discharge unit 127 may have an electrothermal conversion element, instead of the piezoelectric element. In other words, the discharge unit 127 may be constructed to discharge a material using thermal expansion of a material by the electrothermal conversion element. In this case, the discharge method employing the piezoelectric element is advantageous in that it rarely affects the composition of a material in a liquid phase because it does not apply heat to the material in a liquid phase.

(D. Control System)

Figure 4:
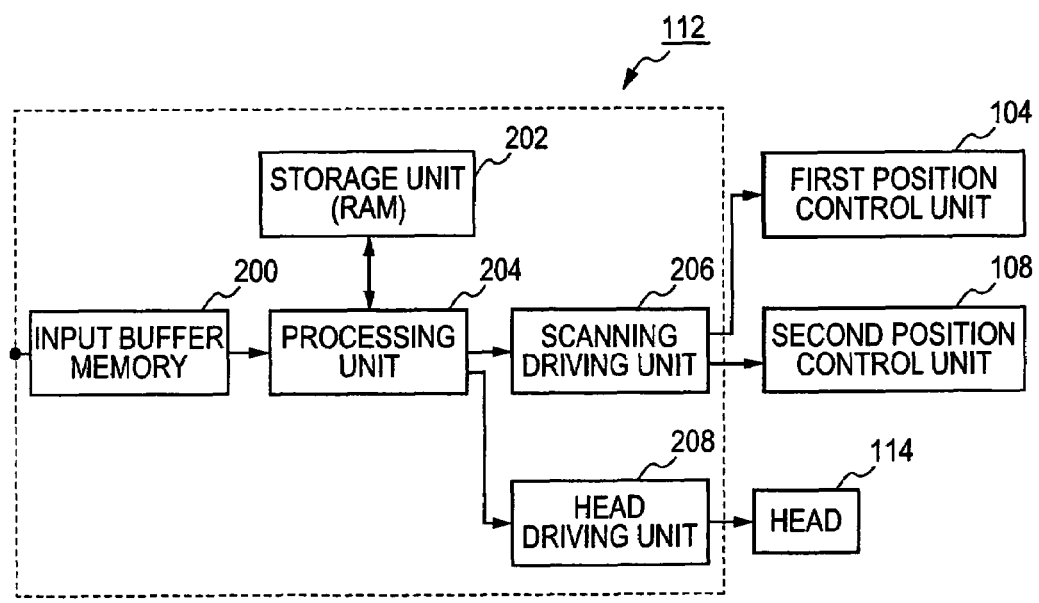
FIG. 4 is a functional block diagram in the droplet discharge device according to the present embodiment.

The construction of the control system 112 will be described below. As shown in FIG. 4, the control system 112 includes an input buffer memory 200, a storage unit 202, a processing unit 204, a scan driving unit 206 and a head driving unit 208. The input buffer memory 200 and the processing unit 204 are communicably connected to each other. The processing unit 204, the storage unit 202, the scan driving unit 206 and the head driving unit 208 are communicably connected to each other through buses (not shown).

The scan driving unit 206 is communicably connected to the first position control unit 104 and the second position control unit 108. In a similar manner, the head driving unit 208 is communicably connected to the head 114.

The input buffer memory 200 receives discharge data for discharging droplets D of the conductive material 8A from an external information processing unit (not shown), which is located outside the droplet discharge device 100. The input buffer memory 200 supplies the discharge data to the processing unit 204. The processing unit 204 stores the discharge data in the storage unit 202. In FIG. 4, the storage unit 202 can be a RAM.

The processing unit 204 supplies the scan driving unit 206 with data indicating the position of each nozzle 118 relative to a target discharge portion on the basis of the discharge data stored in the storage unit 202. The scan driving unit 206 supplies the second position control unit 108 with a stage driving signal depending upon the discharge data and a minimum discharge period Tm (to be described below). As a result, the position of the discharge head unit 103 changes relative to the target discharge portion. Meanwhile, the processing unit 204 supplies the head 114 with a discharge signal based on the discharge data stored in the storage unit 202 and the minimum discharge period Tm. As a result, droplets D of the conductive material 8A are discharged from a corresponding nozzle 118 in the head 114.

The control system 112 is a computer having a CPU, a ROM, a RAM and buses. Due to this, the above-described functions of the control system 112 can be implemented using software programs that are executed by the computer. It is to be understood that the control system 112 may be implemented using a dedicated circuit (hardware).

(E. Grid)

Next, the "minimum discharge period Tm" will be described. The minimum discharge period means a minimum discharge time interval for which droplets D can be continuously discharged from one nozzle 118. The minimum discharge period Tm is determined depending on the viscosity of a material in a liquid phase, the diameter of the nozzle 118, and the like. It is sometimes difficult to continuously discharge droplets D from one nozzle 118 in a time interval which is shorter than the minimum discharge period Tm. This is because a meniscus formed by a material in a liquid phase is sometimes not stable in the nozzle 118. In addition, an inverse number of the minimum discharge period Tm is represented by a maximum discharge frequency Fm.

The material in a liquid phase in the present embodiment is the conductive material 8A. Also, the minimum discharge period Tm of the conductive material 8A is about $5 \times 10^{-5}$ sec, and therefore the maximum discharge frequency Fm is about 20 KHz.

The position of the discharge head unit 103 relative to the stage 106 varies at a uniform velocity Vy of 700 mm/sec over a scanning period. Meanwhile, while the relative position of the discharge head unit 103 varies at the uniform velocity Vy, the head 114 discharges droplets D in the minimum discharge period Tm. Then, the respective droplets D land on a plurality of landable positions CA lined up at intervals of about 35 μm in the Y-axis direction. Therefore, a pitch LY of the plurality of landable positions CA lined up in the Y-axis direction is about 35 μm (see FIG. 5).

Meanwhile, whenever one scanning period has elapsed, the nozzles 118 moves at a moving pitch dx in the X-axis direction until the next scanning period begins. In the present embodiment, since the moving pitch dx is set to be equal to the pitch LY, it is about 35 μm. Since the nozzles 118 move in the X-axis direction by the moving pitch dx, each of droplets D lands at each of the plurality of landable positions CA which are lined up at intervals of about 35 μm in the X-axis direction. Therefore, the pitch LX of the plurality of landable positions CA lined up in the X-axis direction is about 35 μm (see FIG. 5).

As such, the plurality of landable positions CA are lined up at the pitch LX (about 35 μm) in the X-axis direction. Similarly, the plurality of landable positions CA are lined up at the pitch LY (about 35 μm). Accordingly, as shown in FIG. 5, the plurality of landable positions CA forms a grid 30 that are parallel to both the X-axis direction and the Y-axis direction. Also, the grid 30 is included in a scanning range. Moreover, the grid 30 is defined by discharge data. It is noted herein that the number of landable positions CA in the grid 30 according to the present embodiment is M×N (M and N are integers greater than 0). The droplet discharge device 100 can selectively discharge droplets D to a certain landable position CA among such M×N landable positions CA.

In addition, the grid 30 and the landable positions CA in the grid 30 are also used as coordinates on the surface of an object representative by the surface of a substrate 10A which will be described below.

FIG. 5 shows a part of the grid 30. Among a plurality of landable positions CA in FIG. 5, the number of the landable positions CA at which droplets D are to land are seventeen. For the purpose of convenience of description, the landable positions CA at which droplets D are to land are also denoted by "landing positions CP" or "CP (m, n)". "(m, n)" suffixed to the symbol "CP" indicates coordinates of landable positions CA in the grid 30.

Both the landable positions CA and the landing positions CP correspond to almost the central positions of projection images of droplets D. In a case where the droplets D are discharged from the nozzles 118 toward a plane (XY plane) parallel to both the X-axis direction and the Y-axis direction, the projection images of the droplets D mean images which are obtained by projecting the droplets D onto the XY plane. When droplets D are discharged toward the landable position CA (or landing positions CP), the droplets D land in a range of the projection images of the droplets D, respectively, about the landable position CA. After the landing, the droplets D spread from the range of the projection images of the droplets D.

In the present embodiment, the projection images of each of the droplets D are substantially circular, and their diameter is φ. Therefore, when droplets D discharged toward the landable positions CA (or landing positions CP), respectively, the droplets D land in a range determined by a radius φ/2 of the projection images of the droplets D.

In FIG. 5, CP(m, n), CP(m+1, n−2), CP(m+2, n−4), CP(m+3, n−6), and CP(m+4, n−8) are located on a line segment L1 having a slope of (−2). CP(m+4, n−8), CP(m+6, n−8), CP(m+8, n−8), CP(m+10, n−8), CP(m+12, n−8) and CP(m+14, n−8) are located on a line segment L2 parallel to the X-axis direction. CP(m+5, n), CP(m+6, n−2), CP(m+7, n−4), and CP(m+8, n−6) are located on a line segment L3 having a slope of (−2). CP(m+8, n−6), CP(m+10, n−6), CP(m+12, n−6), and CP(m+14, n−6) are located on a line segment L4 parallel to the X-axis direction.

(F. Pattern Forming Method)

(F1. Formation of Pattern Formation Region)

Hereinafter, a method of forming a linear pattern formation region will now described. The pattern formation region includes the range of projection images of droplets D about CP(m, n). Moreover, the pattern formation region includes the range of projection images of droplets D about CP(m+i, n+j). Here, "m" is an integer that is greater than 0 and smaller than M. "n" is an integer that is greater than 0 and smaller than N. "i" is an integer that is other than 0 and is greater than (−m) and smaller than (M−m). "j" is an integer that is other than 0 and is greater than (−n) and smaller than (N−n).

Figure 6A:
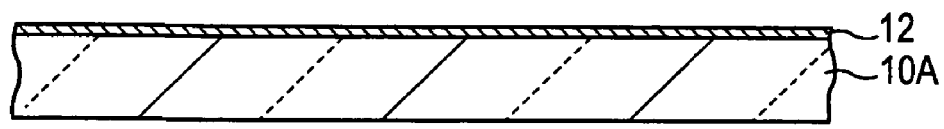
FIG. 6A to FIG. 6D illustrate a method of forming a pattern formation region which is bordered by a bank pattern.

Referring first to FIG. 6A, a surface reforming treatment is performed on the entire surface of the substrate 10A having optical transparency. In the present embodiment, the substrate 10A is a glass substrate. Further, the surface reforming treatment is a HMDS treatment. At this time, the HMDS treatment is a treatment of coating hexamethyldisilazane ($(CH_3)_3SiNHSi(CH_3)_3$) on a surface of an object in the form of vapor. Through the HMDS treatment, a HMDS layer 12 is formed on the substrate 10A. A bank pattern 18 (FIG. 7D) is formed on the HMDS layer 12 thereafter. Further, the HMDS layer 12 can be adhered to as the substrate 10A well as the bank layer 18. For this reason, the HMDS layer 12 serves as an adhesion layer that brings the bank pattern 18 and the substrate 10A into close contact with each other. In addition, the plane shown in FIG. 6 corresponds to a section B'-B in FIG. 8 which will be described below.

Figure 6B:
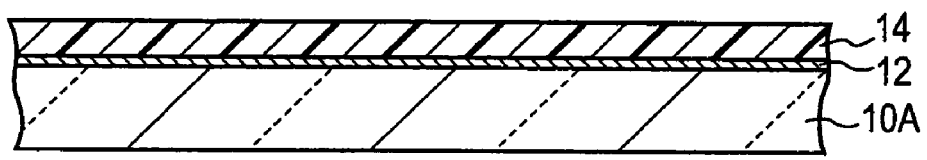

Next, an organic photoresist material is coated on the HMDS layer 12 by means of a spin coating method. At this time, the organic photoresist material is coated so that the bank pattern 18 to be described below has a predetermined thickness (height). The coated organic photoresist material is then cured by irradiating light, thus forming an organic photoresist material layer 14 as shown in FIG. 6B. In the present embodiment, the organic photoresist material layer 14 has a thickness of about 1 μm.

Here, the organic photoresist material of the present embodiment is acrylic resin. It is noted herein that a polymeric material such as a polyimide resin, an olefinic resin, a phenolic resin or a melamine resin may be used instead of an acrylic resin. Further, the organic photoresist material may be coated by means of one of spray coating, roll coating, die coating and dip coating, instead of the above-descried spin coating method.

Figure 6C:
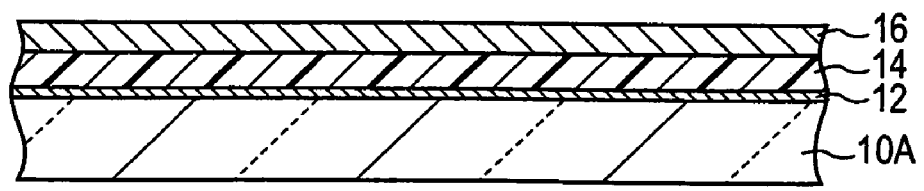
Figure 6D:
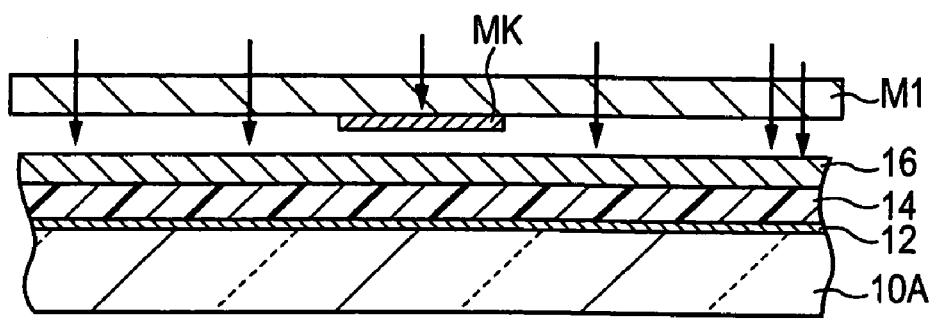

Next, as shown in FIG. 6C, a negative type photoresist is coated on the organic photoresist material layer 14, and a photoresist layer 16 is then formed thereon. As shown in FIG. 6D, the photoresist layer 16 is exposed through a photo mask M1 in which portions corresponding to pattern formation regions 24A, 24B, 24C and 24D (see FIG. 8) to be described below are covered with a light-shielding mask MK.

The above-described photo mask M1 is fabricated as follows. First, a chrome film is formed on a substrate made of glass. Then, a light-shielding mask MK is obtained by patterning the chrome film on the basis of a plurality of landing positions CP and a diameter φ of projection images of droplets D. Specifically, an electron-ray drawing apparatus or a laser apparatus selectively exposes a resist film provided on the chrome film according to the discharge data and the diameter φ of projection images of droplets D. Then, a light-shielding mask MK is obtained by etching the chrome film after the selectively exposed resist film is developed.

Figure 7A:
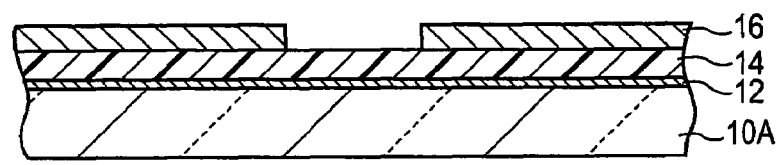
FIG. 7A to FIG. 7D illustrate the method of forming a pattern formation region which is bordered by a bank pattern.
Figure 7B:
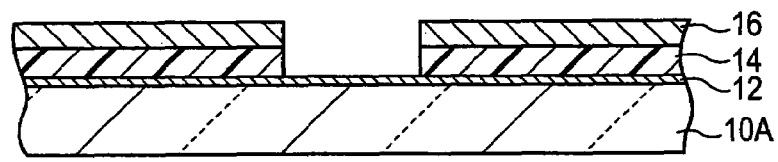
Figure 7C:
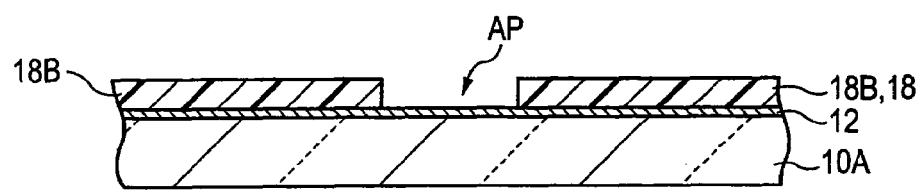

Next, as shown in FIG. 7A, the exposed photoresist layer 16 is developed. As shown in FIGS. 7B and 7C, the organic photoresist material layer 14 is etched, and the photoresist layer 16 remaining after the etching is then stripped. The bank pattern 18 (see FIG. 8) composed of a plurality of banks 18B is thus obtained from the organic photoresist material layer 14. In addition, the plane shown in FIG. 7 corresponds to a section B'-B in FIG. 8 which will be described below.

The bank pattern 18 borders the two-dimensional shape of a wiring pattern or a thin film pattern. Further, the bank pattern 18 serves as a partition member in a subsequent discharge process. In addition, since the organic photoresist material constituting the bank pattern 18 is acrylic resin, the bank pattern 18 has optical transparency. In this case, the bank pattern 18 may be formed by means of a printing method (so-called complete additive process), instead of a patterning method by photolithography. The bank pattern 18 may be formed by any method if only the bank pattern 18 borders the two-dimensional shape of the wiring pattern.

In this case, the two-dimensional shape of the wiring pattern is almost the same as that of a bottom surface (i.e., a portion that touches the plane defined by the substrate 10A) of the wiring pattern.

In addition, any materials having a main chain of an inorganic skeleton (siloxane bond) and an organic group may be used as the material of the bank pattern 18. Further, a bank pattern (a convex portion) may have a structure of two or more layers in which a lower layer is made of an inorganic substance and an upper layer is made of an organic substance. Moreover, the photoresist layer 16 may remain on the bank pattern 18 without being stripped.

The bank pattern 18 has a plurality of apertures AP through which the HMDS layer 12 formed on the substrate 10A is exposed. Further, the shape of each of the plurality of apertures AP is substantially identical to the two-dimensional shape of each of a plurality of conductive layers 8 (see FIG. 9D). In other words, in the present embodiment, the bank pattern 18 has a shape that completely surrounds the circumference of each of the plurality of conductive layers 8 to be formed later. In addition, the pattern of each of the conductive layer 8 corresponds to the above-described "wiring pattern".

It is to be understood that the bank pattern 18 may have a plurality of banks 18B (FIG. 8), which are separated from each other. For example, the two-dimensional shape of one conductive layer 8 may be bordered between a pair of the banks 18B, which are separated from each other by a predetermined distance and are substantially parallel to each other. In this case, the banks 18B may not exist at portions corresponding to both ends of the conductive layer 8. That is, it is not necessary for the bank pattern 18 to completely surround the circumference of the two-dimensional shape of the conductive layer 8.

In addition, the width of the aperture AP at its top is preferably greater than that of the aperture AP at its bottom (on the side of the substrate 10A). This is because droplets D of the conductive material 8A can be spread easier.

Figure 7D:
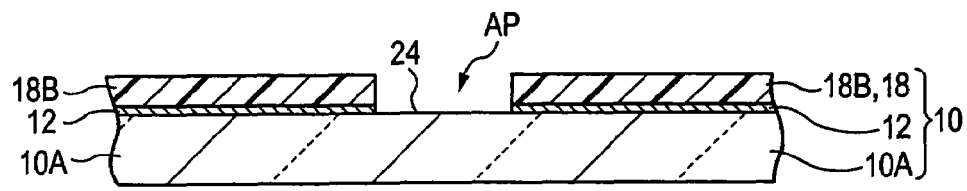

After the bank pattern 18 is formed on the HMDS layer 12, a hydrofluoric acid treatment is performed on the substrate 10A. The hydrofluoric acid treatment is a treatment of etching the HMDS layer 12 using, e.g., a 2.5% aqueous hydrofluoric acid solution. In this case, since the bank pattern 18 serves as a mask, the HMDS layer 12 at the bottom of the apertures AP is removed, thereby exposing the substrate 10A, as shown in FIG. 7D.

Next, a lyophilic treatment process in which a lyophilic property is imparted to the bottom of each of the plurality of apertures AP is then performed. The lyophilic treatment process may employ an ultraviolet (UV) radiation treatment of radiating UV light, an $O_2$ plasma treatment using oxygen as a treatment gas in the atmosphere, or the like. Here, the $O_2$ plasma treatment is carried out.

The $O_2$ plasma gas treatment is a treatment in which a plasma discharge electrode (not shown) radiates oxygen in a plasma state to the substrate 10A (the substrate 10). As exemplary conditions of the $O_2$ plasma treatment, plasma power is 50 to 1000 W, the flow rate of the oxygen gas is 50 to 100 mL/min, the moving speed of the substrate 10 relative to the plasma discharge electrode is 0.5 to 10 mm/sec, and the temperature of the substrate is 70 to 90° C.

In this case, it is preferred that the lyophilic treatment process (in this case, $O_2$ plasma treatment) is performed on the bottom of each of the apertures AP such that a contact angle of the conductive material 8A in a liquid phase on the bottom of each of the apertures AP is below 20 degrees. In a case where the substrate 10A is the glass substrate as in the present embodiment, the surface of the substrate 10A has a certain degree of the lyophilic property to the conductive material 8A in a liquid phase. In this case, the lyophilic treatment process may not be performed. Even though the $O_2$ plasma treatment or the UV radiation treatment is performed, the photoresist that may remain on the bottom of each of the apertures AP or residual debris of the HMDS layer can be completely removed. It is thus preferable that the lyophilic treatment process is performed. Further, the lyophilic treatment process can be a process in which the $O_2$ plasma treatment and the UV radiation treatment are combined together.

Further, since the HMDS layer 12 on the bottom of each of the apertures AP is sufficiently removed through the $O_2$ plasma treatment or the UV radiation treatment, there is a case where the removal of the HMDS layer 12 may not be performed by means of the above-described hydrofluoric acid treatment. Even in that case, if the aforementioned hydrofluoric acid treatment and the lyophilic treatment process are carried out, the HMDS layer 12 on the bottom of each of the apertures AP can be certainly removed. Therefore, it is preferable to perform the hydrofluoric acid treatment and the lyophilic treatment process.

Next, a lyophobic treatment process is then performed on the bank pattern 18, and a lyophobic property is imparted to a surface of the bank pattern 18. The lyophobic treatment process can adopt a plasma treatment method (a $CF_4$ plasma treatment method) using $CF_4$ carbon (tetrafluoromethane) as a treatment gas. As conditions of the $CF_4$ plasma treatment, for example, plasma power is 50 to 1000 W, the flow rate of a $CF_4$ carbon gas is 50 to 100 mL/min, the carrying rate of a substrate with respect to a plasma discharge electrode is 0.5 to 1020 mm/sec, and the temperature of a substrate is 70 to 90° C. Further, the treatment gas may include other fluorocarbon-based gases or gases such as $SF_6$ or $SF_5CF_3$ instead of tetrafluoromethane.

By performing the lyophobic treatment process, since a fluoric group is introduced into resin constituting the bank pattern 18, a high lyophobic property is thus imparted to the surface of the bank pattern 18. Moreover, the $O_2$ plasma treatment as the lyophilic treatment process may be performed before the formation of the bank pattern 18. In this case, however, acrylic resin, polyimide resin, etc. have a property that they are easily fluorinated (a lyophobic property) when undergoing a pre-treatment using $O_2$ plasma. Accordingly, it is preferred that the $O_2$ plasma treatment is performed after the bank pattern 18 is formed.

A bottom surface of each of the apertures AP can substantially maintain the lyophilic property which has already been imparted although it undergoes the lyophobic treatment process performed on the bank pattern 18. In particular, since the substrate 10A of the present embodiment is the glass substrate, the fluoric group is not introduced into the surface (the bottom of each of the apertures AP) of the substrate 10A even if the substrate 10A undergoes the lyophobic treatment process. Thus, the lyophilic property of the pattern formation region 24, e.g., wettability is not affected.

In the present embodiment, after the lyophobic treatment process is performed on the bank pattern 18, the hydrofluoric acid treatment is again performed on the bottom (the pattern formation region 24) of each of the apertures AP. By doing so, the surface (glass) of the substrate 10A is exposed at the bottom of the aperture AP very well. Consequently, the lyophilic property at the bottom of each of the apertures AP can be sustained easily.

The lyophobic property on the surface of the bank pattern 18 becomes higher than the lyophobic property on the bottom of each of the apertures AP through the above-described lyophilic treatment process and the lyophobic treatment process. In the present embodiment, the bottom of each of the apertures AP has more like the lyophilic property. In addition, as described above, since the substrate 10A of the present embodiment is made of glass, the fluoric group is not introduced into the bottom of each of the apertures AP even if the $CF_4$ plasma treatment is performed. Due to this, although only the $CF_4$ plasma treatment (the lyophobic treatment process) is performed without carrying out the $O_2$ plasma treatment (the lyophilic treatment process), the lyophobic property on the surface of the bank pattern 18 becomes higher than the lyophobic property on the bottom of each of the apertures AP. As described above, however, since there are advantages that the residual debris on the bottom of each of the apertures AP is completely removed and the bank pattern 18 becomes easily fluorinated, the $O_2$ plasma treatment is not omitted in the present embodiment.

In the present embodiment, the bottoms of the plurality of apertures AP which have undergone the lyophilic treatment process correspond to the pattern formation regions 24A, 24B, 24C and 24D, respectively. In a where the bottoms of the apertures AP already have a desired lyophilic property to the conductive material 8A, however, the lyophilic treatment process can be omitted as described. In this case, the bottoms of the plurality of apertures AP directly correspond to the pattern formation regions 24A, 24B, 24C and 24D, respectively.

Figure 8:
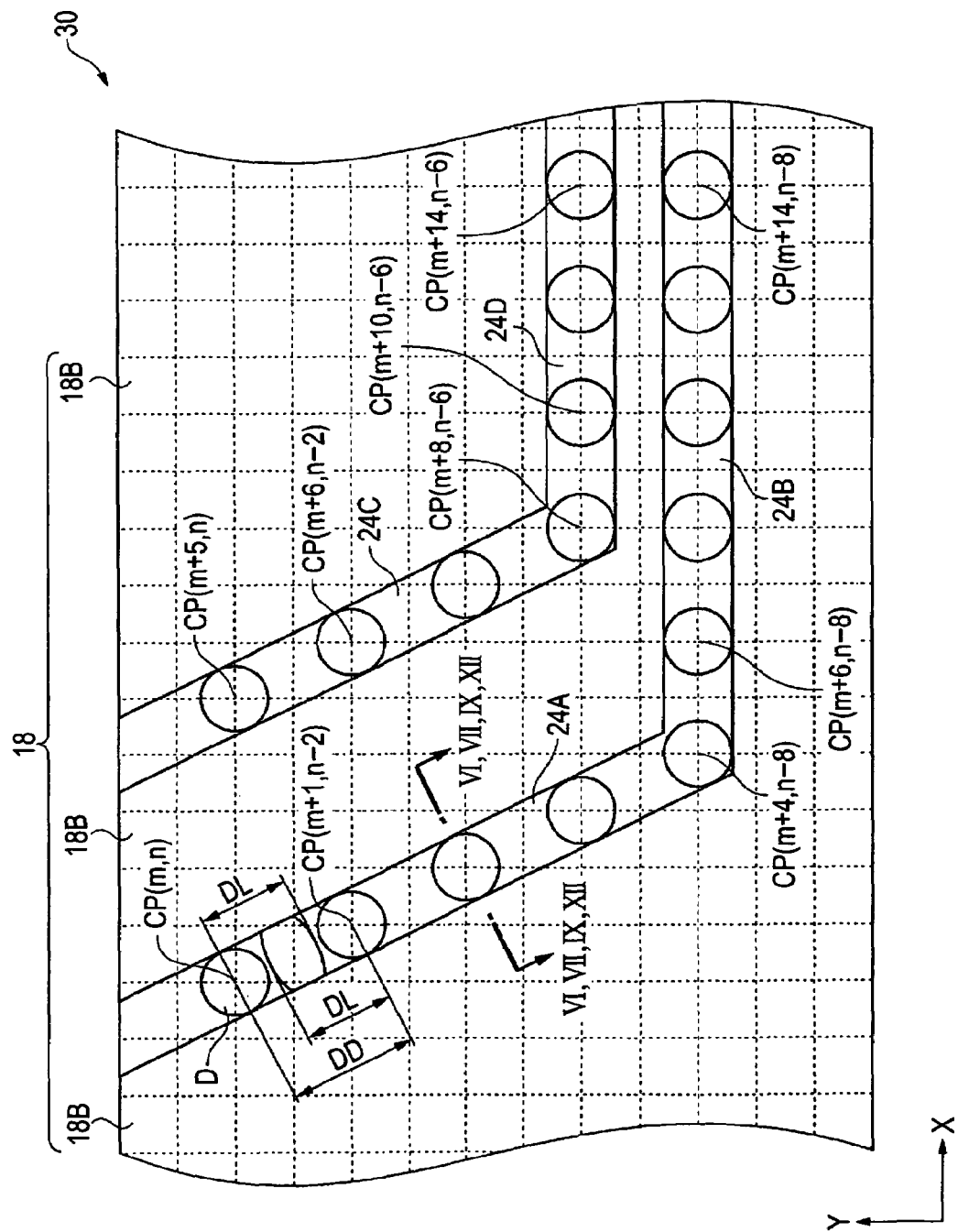
FIG. 8 is a schematic view showing a pattern formation region which is bordered by a bank pattern.

In such as manner, as shown in FIG. 8, the pattern formation regions 24A, 24B, 24C and 24D whose two-dimensional shape are respectively bordered by the bank pattern 18 are provided on the substrate 10A. Each of the pattern formation regions 24A, 24B, 24C and 24D is provided with a wiring pattern composed of the conductive layer 8 by a discharge process which will be described below. In addition, in the present embodiment, the substrate 10A provided with the pattern formation regions 24A, 24B, 24C and 24D corresponds to the substrate 10 (see FIG. 2).

It is noted herein that the linear pattern formation regions 24A, 24B, 24C and 24D correspond to the line segments L1, L2, L3 and L4, respectively. Also, the linear pattern formation regions 24A and 24B are connected to each other. Similarly, the linear pattern formation regions 24C and 24D are connected to each other. Moreover, the linear pattern formation regions 24A, 24B, 24C and 24D have a width slightly larger than the diameter $\phi$ of droplets D. In the present embodiment, the width of the linear pattern formation regions is about 20 μm. In addition, the width of the pattern formation regions 24A, 24B, 24C and 24D is a length along a direction orthogonal to their longitudinal direction.

The projection images of the seventeen droplets D corresponding to the seventeen landing positions CP shown in FIG. 5 fall within the pattern formation regions 24A, 24B, 24C and 24D, respectively. In the following description, the above-described grid 30 is used as a coordinate system that indicates a position on the substrate 10A.

The pattern formation region 24A has a linear shape between CP(m, n) and CP(m+1, n−2). Accordingly, the pattern formation region 24A has a slope of (−2) between CP(m, n) and CP(m+1, n−2). Similarly, the shape of the pattern formation region 24A is a linear shape that has a slope of (−2) between CP(m+1, n−2) and CP(m+4, n−8).

The pattern formation region 24B has a linear shape between CP(m+4, n−8) and CP(m+6, n−8). Accordingly, the pattern formation region 24B is parallel to the X-axis direction between CP(m+4, n−8) and CP(m+6, n−8). Similarly, the pattern formation region 24B is parallel to the X-axis direction between CP(m+6, n−8) and CP(m+14, n−8).

The pattern formation region 24C has a linear shape between CP(m+5, n) and CP(m+6, n−2). Accordingly, the pattern formation region 24C has a slope of (−2) between CP(m+5, n) and CP(m+6, n−2). Similarly, the shape of the pattern formation region 24C is a linear shape that has a slope of (−2) between CP(m+6, n−2) and CP(m+8, n−6).

The pattern formation region 24D has a linear shape between CP(m+8, n−6) and CP(m+10, n−6). Accordingly, the pattern formation region 24D is parallel to the X-axis direction between CP(m+8, n−6) and CP(m+10, n−6). Similarly, the pattern formation region 24D is parallel to the X-axis direction between CP(m+10, n−6) and CP(m+14, n−6).

(F2. Discharge Process)

Next, a first droplet D is discharged toward a landable position CA represented by CP(m, n) and a second droplet D is discharged toward a landable position CA represented by CP(m+i, n+j), thereby forming the conductive material layer 8B covering the pattern formation regions 24A, 24B, 24C and 24D. In the present embodiment, respective droplets D are discharged toward all the seventeen landing positions CP from one nozzle 118. Of course, droplets D are discharged from the plurality of nozzles 118 as shown in FIG. 3A.

First, the substrate 10 in which the plurality of pattern formation regions 24A, 24B, 24C and 24D are formed is positioned on the stage 106 of the droplet discharge device 100. As a result, a surface of each of the plurality of pattern formation regions 24A, 24B, 24C and 24D becomes parallel to the X-axis direction and the Y-axis direction.

Also, the droplet discharge device 100 discharges droplets D toward the landing positions CP on the pattern formation regions 24A, 24B, 24C and 24D. Then, the conductive material layer 8B covering the pattern formation regions 24A, 24B, 24C and 24D is obtained.

Figure 9A:
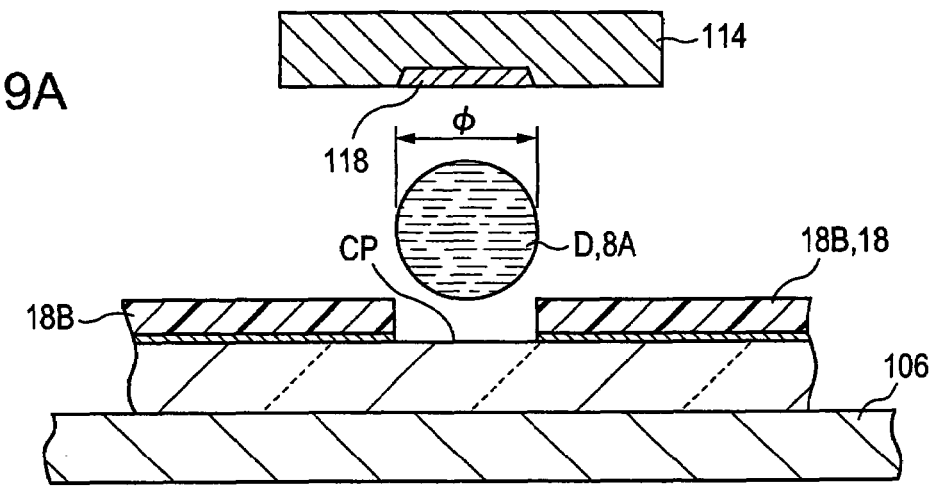
FIG. 9 is a schematic view showing a method of forming a conductive layer in a pattern formation region according to the present embodiment.

Specifically, the droplet discharge device 100 changes a position of the nozzle 118 relative to the substrate 10A at uniform velocity Vy in the positive direction of the Y-axis direction from one end of a scanning range toward the other end thereof. Then, as shown in FIG. 9A, whenever the nozzle 118 reaches positions corresponding to the landing positions CP, droplets D of the conductive material 8A are discharged from the nozzle 118. When the nozzle 118 reaches the other end of the scanning range, as its relative position, the nozzle 118 moves by the moving pitch dx in the X-axis direction, and the droplet discharge device 100 changes the position of the nozzle 118 relative to the substrate 10 at the uniform velocity Vy in the negative direction of the Y-axis direction. Whenever the nozzle 118 corresponds to each of the landing positions CP, droplets of the conductive material 8A are discharged from the nozzle 118. By repeating the relative movement of the nozzle 118 and the discharge of droplets D in this way, the droplet discharge device 100 discharges droplets D toward all the landing positions CP in the scanning range.

Here, the volume of the droplets D which are discharged toward the landing position CP in the pattern formation regions 24A and 24C is a first volume. Meanwhile, the volume of the droplets D which are discharged toward the landing positions CP in the pattern formation regions 24B and 24D. The reason is as follows.

The shape of the pattern formation regions 24A and 24C is not parallel to both the X-axis direction and the Y-axis direction. On the other hand, the shape of the pattern formation regions 24B and 24D is a linear shape parallel to the X-axis direction. Therefore, the distance between the two adjacent landing positions CP in the pattern formation regions 24B and 24D is shorter than the distance between two the adjacent landing positions CP in the pattern formation regions 24A and 24C. Meanwhile, the distance by which a landed droplet D spread is finite. From these points, the volume of the droplets D which are discharged toward the pattern formation regions 24B and 24D is made smaller than the volume of the droplets D which are discharged toward the pattern formation regions 24A and 24C, so that the volumes of the conductive material 8A per unit area in the pattern formation regions 24A, 24B, 24C and 24D can be made equal to each other.

Figure 9B:
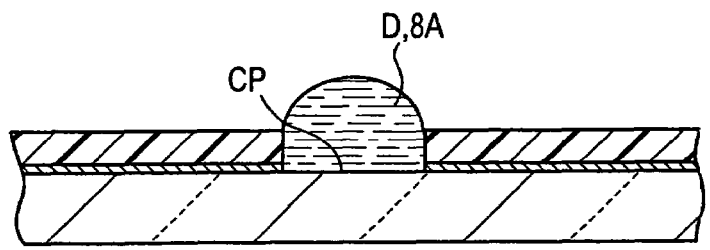
Figure 9C:
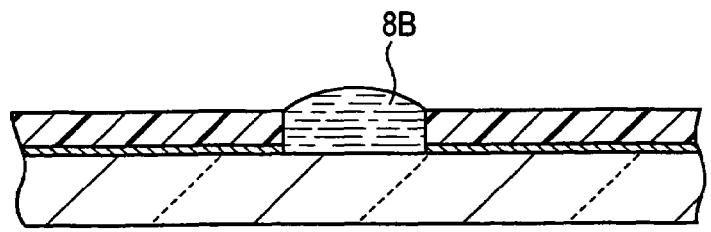
Figure 9D:
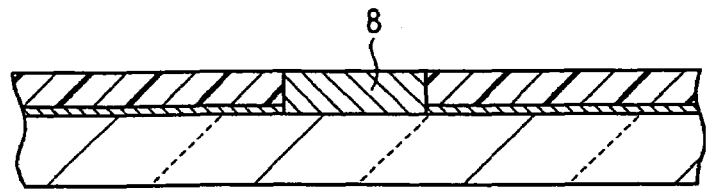

As shown in FIG. 9B, if a droplet D of the conductive material 8A lands at a landing position CP, the droplet spreads in the longitudinal direction of the pattern formation region 24A (or 24B, 24C, 24D). Here, the longitudinal direction of the pattern formation region 24A is a direction perpendicular to the paper. Also, as shown in FIG. 9C, the droplet D spreads in the longitudinal direction of the pattern formation region 24A, and thereby the conductive material 8A is formed.

As the droplets D which have landed (collided against) at the two adjacent landing positions CP spread, they flow into each other. This is because the two adjacent landing positions CP are closer to each other in a distance DD (see FIG. 8) therebetween. Specifically, this is because the distance DD is shorter than two times a distance DL between a boundary in a range in which one droplet D spreads about a landing position CP and its landing position CP. In addition, as described above, the landing position CP substantially coincides with the central position of the droplet D discharged.

The volume and the number of droplets D are defined in the above discharge data such that the thickness of the conductive layer 8 (see FIG. 9D), which is obtained after an activation process to be described below, becomes about 1 μm. Further, the sections shown in FIGS. 9A to 9D correspond to that taken along a line IX-IX in FIG. 8.

In addition, drying of the conductive material layer 8B may be promoted using a heater 140 (see FIG. 2) in the course of the discharge process.

(F3. Activation Process)

After the conductive material layer 8B is formed on all the pattern formation regions 24A, 24B, 24C and 24D, the conductive material layer 8B is activated in order to obtain the conductive layer 8. Specifically, the conductive material layer 8B is baked (heated) to sinter or fuse silver particles contained in the conductive material layer 8B. In order to perform this process, the carrier device 170 picks up the substrate 10A from the droplet discharge device 100, and then carries it into the clean oven 150. The clean oven 150 then bakes the substrate 10A.

The activation process of the present embodiment is a heating process that is performed in the atmosphere. The heating process may be carried out in an atmosphere of inert gas such as nitrogen, argon or helium, or in a reduction atmosphere such as hydrogen, if required. The processing temperature of the heating process can be appropriately determined in consideration of a boiling point (vapor pressure) of a dispersion medium, the type and pressure of an ambient gas, thermal behavior such as the dispersibility or oxidizability of silver particles in the conductive material layer 8B, whether a coating agent covering silver particles exists or not, the amount of the coating agent, an upper temperature limit of the substrate 10A, and the like.

In the activation process of the present embodiment, the conductive material layer 8B is baked (heated) in the atmosphere using the clean oven 150 at a temperature of 280 to 300° C. for 300 minutes. At this time, in order to remove organic components from the conductive material layer 8B, the conductive material layer 8B is preferably baked (heated) at a temperature of about 200° C. When a plastic substrate is used instead of the substrate 10A made of glass, however, the conductive material layer 8B is preferably baked (heated) at a temperature higher than room temperature and lower than 250° C.

The activation process may be a process of irradiating UV light to the conductive material layer 8B, instead of the above heating process. Further, the activation process may be a process in which the heating process and the UV light irradiation process are combined together.

Through the above-described processes, a pattern (i.e., wiring pattern) of the conductive layer 8, which covers the four pattern formation regions 24A, 24B, 24C and 24D, respectively, can be obtained. In this way, a wiring pattern inclined with respect to the direction in which the nozzle 118 moves relatively, and another wiring pattern parallel to the direction in which the nozzle 118 moves relatively can be formed one substrate.

(Electronic Apparatus)

Figure 10A:
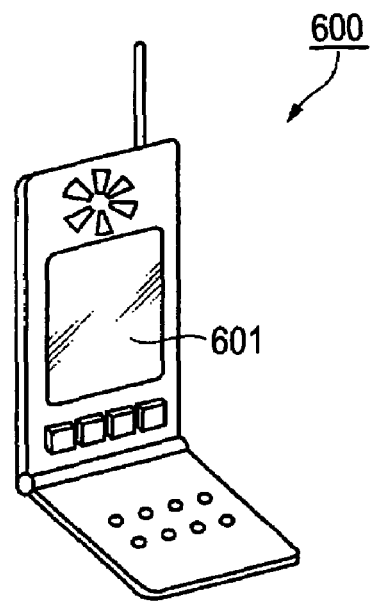
FIG. 10 is a schematic view showing electronic apparatus according to the present embodiment.
Figure 10B:
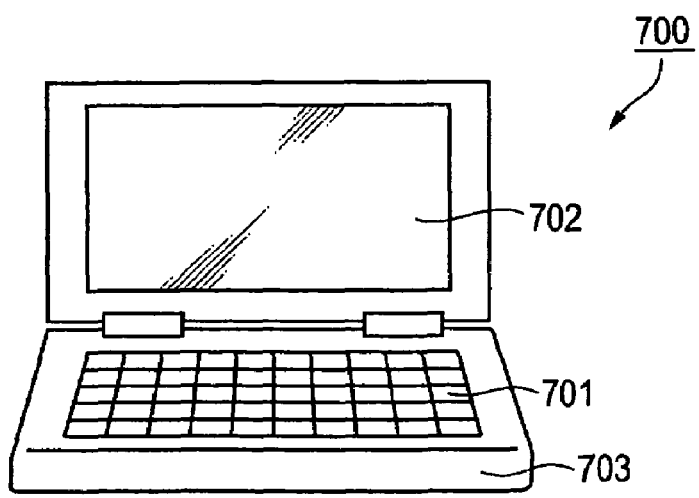
Figure 10C:
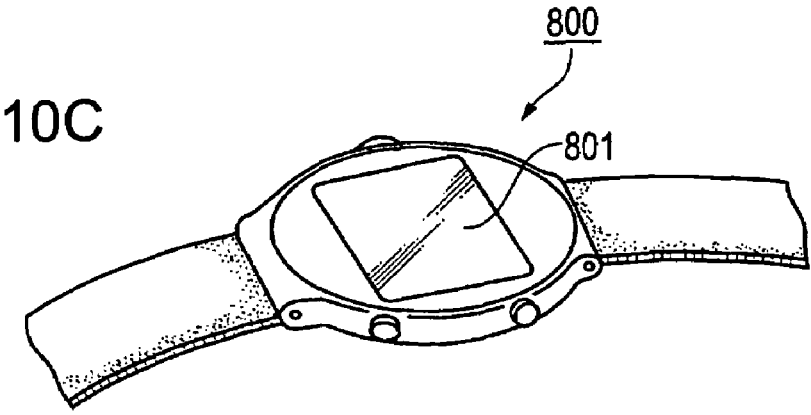

Specific examples of electronic apparatuses according to the invention will be described. A mobile telephone 600 shown in FIG. 10A includes a liquid crystal display device 601 fabricated according to the manufacturing method of the embodiments. A portable information processing apparatus 700 shown in FIG. 10B includes a keyboard 701, an information processing body 703, and a liquid crystal display device 702 fabricated according to the manufacturing method of the embodiments. Concrete examples of such a portable information processing apparatus 700 include a word processor and a personal computer. A wristwatch type electronic apparatus 800 shown in FIG. 10C includes a liquid crystal display device 801 fabricated according to of the manufacturing method of the embodiments.

According to the present embodiment, the invention is applied to formation of wiring patterns in liquid crystal display devices. However, the invention may also be applied to formation of wiring patterns in an electroluminescent display device, a plasma display devices, an SED (Surface-Conduction Electron-Emitter Display) device, or an FED (Field Emission Display) device.

In addition, in the present specification, the liquid crystal display device, the electroluminescent display device, the plasma display device, SED, FED and the like can also be referred to as "electro-optical device". In this case, the "electro-optical device" in the present specification refers to all kinds of devices that emit, transmit or reflect light upon application of a signal voltage, not limited to devices which utilize changes in optical characteristics (so-called electro-optical effects), such as a change in birefringence, a change in optical rotation and a change in light scattering.

Although the foregoing description has been made on the preferred embodiments according to an aspect of the invention with reference to the accompanying drawings, the invention is not limited to the above exemplary embodiments. Various shapes of components or their combinations in the above described examples are simply exemplary ones. Therefore, various modifications can be made thereto based on design requirements without departing from sprit or scope of the invention.

(Modification 1)

According to the above embodiments, each of the linear pattern formation regions 24A, 24B, 24C and 24D includes four or more landing positions CP. However, the number of landing positions CP included in one pattern formation region 24A (or 24B, 24C, 24D) may be two. Specifically, the number of landing positions CP included in a pattern formation region may be any one of two or more if only the droplets D landed at two adjacent landing positions CP can flow into each other.

Each of a plurality of pattern formation regions 24E and 24F shown in FIG. 11 includes two landing positions CP. Also, the pattern formation region 24E having a slope of (−0.5) and the pattern formation region 24F having a slope of (−2) are connected to each other. It is noted herein that a landing position CP located at a boundary between the two adjacent pattern formation regions 24E and 24F corresponds to both the two pattern formation regions 24E and 24F. The pattern forming method according to the invention can also be applied to a method of forming a pattern which has such a shape. However, if a position has a smaller change in slope, disconnection hardly occurs in a wiring pattern. Therefore, it is advantageous that one linear pattern formation region 24A (or 24B, 24C, 24D) has a longer length.

The shape of a pattern formation region 24 which is bordered by the bank pattern 18 or the lyophobic pattern 58 may not be linear. As an example, FIG. 11 illustrates four pattern formation regions 24G each having a curved shape. In this way, if only the droplets D landed at the two adjacent landing positions CP can flow into each other, the shape of the pattern formation region 24 (or 24G) may be linear or curved. In FIG. 11, each of the four pattern formation regions 24G includes two landing positions CP. In this case, it is noted herein that the landing position CP located at the boundary between two adjacent pattern formation regions 24G corresponds to both the two pattern formation regions 24G.

(Modification 2)

According to the above embodiments, the bank pattern 18 borders the pattern formation regions 24A, 24B, 24C and 24D. However, instead of the bank pattern 18, the lyophobic pattern 58 may border the pattern formation regions 24A, 24B, 24C and 24D. A method of forming the lyophobic pattern 58 is as follows.

A lyophobic treatment process is first performed on a surface of the substrate 10A. One of the methods of the lyophobic treatment process may include a method of forming a self-assembled film that is made of an organic molecule film, etc. on the surface of the substrate 10A.

Molecules constituting the organic molecule film have a functional group that can be bonded to the substrate 10A, a functional group that reforms characteristics of the surface of the substrate 10A (that controls surface energy), and a normal chain of carbon or a partially branched carbon chain, which bonds these functional groups together. Further, the molecules are bonded to the substrate 10A to form a molecule film, for example, a monomolecular film.

The self-assembled film is a film composed of molecules that are aligned in the same direction. These molecules have a bonding functional group that can react with atoms constituting the substrate, such as the surface of the substrate 10A, etc. and other normal chain molecules. Also, the molecules have a very high alignment property with the help of the interaction between the normal chain molecules. In addition, since the self-assembled film is composed of molecules that are aligned in the same direction, the thickness of the self-assembled film is very small. Moreover, the thickness is uniform in the molecular level. Furthermore, since the self-assembled film is also located at the same level as that of a monomolecule over the surface of the self-assembled film, surface characteristics (e.g., a lyophobic property) of the self-assembled film are also uniform over the surface.

An example of a compound that can constitute the organic molecule film to be the self-assembled film, and has the lyophobic property is fluoroalkylsilane (hereinafter, also referred to as "FAS"). If FAS is bonded to the underlying substrate 10A, molecules are aligned in such a way that a fluoroalkyl group is located on a free surface, thereby forming a self-assembled film (hereinafter, also referred to as an "FAS film"). The surface of the FAS film on which the fluoroalkyl group is aligned has low surface energy and has a lyophobic property accordingly. As such, when the FAS film is formed on the surface of the substrate 10A, the lyophobic property is imparted to the surface of the substrate 10A. Further, the FAS film has high durability because it not only imparts the lyophobic property to the surface of the substrate 10A, but also has high adhesiveness to the substrate 10A.

FAS includes fluoroalkylsilane such as heptadecafluoro-1,1,2,2tetrahydrodecyltriethoxysilane, heptadecafluoro-1,1,2,2tetrahydrodecyltrimethoxysilane, heptadecafluoro-1,1,2,2tetrahydrodecyltrichlorosilane, tridecanfluoro-1,1,2,2tetrahydrooctyltriethoxysilane, tridecanfluoro-1,1,2,2tetrahydrooctyltrimethoxysilane, tridecanfluoro-1,1,2,2tetrahydrooctyltrichlorosilane and trifluoroprophyltrimethoxysilane. In practical use, one compound is preferably used independently. It is to be understood that two or more kinds of compounds can be used, not limited one kind of a compound, if they do not degrade a desired object of the invention.

More particularly, FAS is generally represented by the structural formula $R_nSiX_{(4-n)}$. Here, "n" indicates an integer from 1 to 3, and "X" indicates a hydrolytic group such as a methoxy group, an ethoxy group and halogen atoms. Further, "R" is a fluoroalkyl group, and has the structure of $(CF_3)(CF_3)X(CH_3)_y$ (where, "x" is an integer from 0 to 10, and "y" is an integer from 0 to 4). In a case where a plurality of R or X is bonded to Si, R and X may be the same or different from each other. The hydrolytic group indicated by X forms silanol with hydrolysis. The hydrolytic group reacts with the hydroxy group at the substrate such as the substrate 10A (glass, silicon, etc.), and bonds with the substrate 10A through siloxane bond. Meanwhile, since R has a fluoric group such as $CF_3$ on its surface, it is reformed into a surface (having a low surface energy), which causes a surface of an underlying object (in this case, the substrate 10A) not to get wet.

A method of forming a FAS film in a vapor phase on the substrate 10A is as follows. A raw compound (i.e., FAS) and the substrate 10A are contained in the same airtight container. For example, they are left for about 2 to 3 days at room temperature. By doing so, a self-assembled film (i.e., an FAS film) composed of an organic molecule film is formed on the substrate 10A. Further, in a case where the airtight container is maintained at a temperature of 100° C., an FAS film is formed on the substrate 10A after about three hours.

Further, a method of forming an FAS film in a liquid phase on the substrate 10A is as follows. A pre-treatment is first performed by irradiating the surface of the substrate 10A with UV light, or cleaning it by using a solvent. The substrate 10A is then dipped in a solution containing a raw compound (i.e., FAS), and then washed and dried to form a self-assembled film (an FAS film) on the substrate 10A. Alternatively, the pre-treatment that is performed on the surface of the substrate 10A may be omitted, if needed.

Figure 12A:
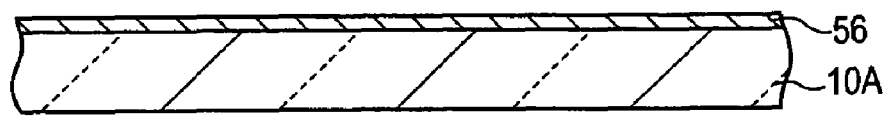
FIG. 12A to FIG. 12C are schematic views a method of forming a pattern formation region which is bordered by a lyophobic pattern.
Figure 12B:
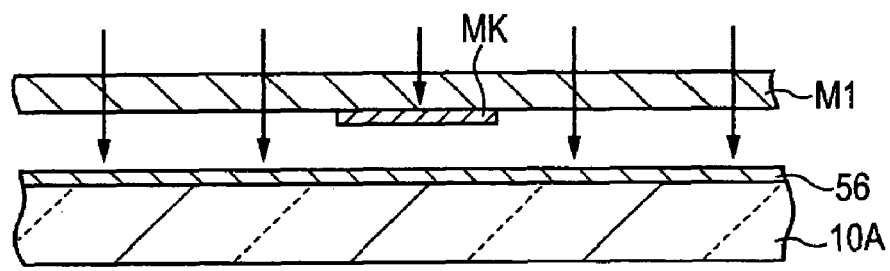
Figure 12C:
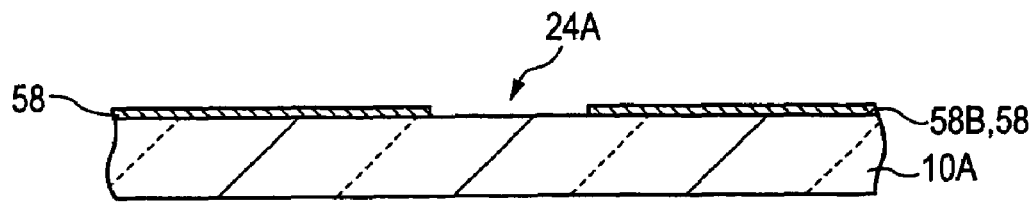

By doing so, a lyophobic film (an FAS film) 56 is formed on the substrate 10A, as shown in FIG. 12A. As shown in FIG. 12B, the FAS film 56 is exposed through a photo mask M1 in which a portion that borders a two-dimensional shape of a wiring pattern is covered with a light-shielding mask MK. Then, since the lyophobic film 56 on which light is radiated is dissolved, a lyophobic pattern 58 is formed, as shown in FIG. 12C. At the same time, a plurality of portions (the surface of the substrate 10A) which respectively borders the two-dimensional shape is exposed through the lyophobic pattern 58.

The lyophobic pattern 58 has a shape that completely surrounds the circumstance of each of the plurality of conductive layers 8 which will be formed later. It is, however, to be noted that the lyophobic pattern 58 may be composed of a plurality of lyophobic portions 58B that are separated from each other. For instance, the two-dimensional shape of one conductive layer 8 may be bordered between a pair of the lyophobic portions 58B that are separated at a predetermined distance therebetween and are located parallel to each other. In this case, the lyophobic portions 58B may not be formed at portions corresponding to both ends of the conductive layer 8. In other words, it is not necessary for the lyophobic pattern 58 to completely surround the circumstance of the two-dimensional shape of the conductive layer 8.

In the present modification, each of the plurality the portions whose two-dimensional shape is bordered by the lyophobic pattern 58 is also referred to as "pattern formation regions 24A, 24B, 24C and 24D".

In addition, one of indices indicating a lyophobic property of an object surface is a contact angle indicated by a material in a liquid phase on the object surface. As the contact angle indicated by the material in a liquid phase on the object surface is greater, the object surface has a lyophobic property higher than that of the material in a liquid phase. In the present embodiment, the contact angle indicated by the conductive material 8A on the lyophobic pattern 58 is at least 30°, which is greater than that indicated by the conductive material 8A on the pattern formation region 24.

(Modification 3)

In the above embodiments, the direction in which the nozzle 118 moves relative to the stage 106 is parallel to both two directions (X-axis direction and Y-axis direction) orthogonal to each other. Therefore, the grid 30 is rectangular. However, the two directions may not be orthogonal to each other if only the nozzle 118 moves in a two-dimensional way relative to the stage 106. In other words, the nozzle 118 has only to relatively move in two directions (the first direction and the second direction in the invention) different from each other. In this case, the shape of the grid 30 in the above embodiments becomes parallelogram.

(Modification 4)

According to the above embodiments, a wiring patterning is formed using the wiring pattern forming method of the invention. However, the pattern forming method of the invention is not limited to the above aspects of the method of forming a wiring pattern. The pattern forming method of the invention may be applied to a method of forming a pattern composed of an insulating material layer, instead of the wiring pattern.

(Modification 5)

According to the above embodiments, the conductive material layer 8B is finally activated by heating with the green oven 150. However, instead of the heating, the conductive material layer 8B may be activated by irradiating it with electromagnetic waves such as light having a wavelength within an infrared region or a visible light region. Further, instead of such activation, the conductive material layer 8B may be simply dried. This is because a given conductive material layer 8B is formed simply by leaving the conductive material layer 8B as it is. However, simply drying the conductive material layer 8B requires a shorter generation time to generate the conductive material layer 8 than activating the conductive material layer 8B. Therefore, activating the conductive material layer 8B is more preferable.

(Modification 6)

In the above embodiments, the linear pattern formation regions 24A and 24C are not parallel to the X-axis direction. Also, the angle that is defined by the pattern formation region 24A and the X-axis direction is equal to the angle that is defined by the pattern formation region 24C and the X-axis direction. However, the pattern formation regions 24A and 24C that are not parallel to the X-axis direction may have angles different from each other with respect to the X-axis direction. In other words, the angle that is defined by the pattern formation region 24A and the X-axis direction may be different from the angle that is defined by the pattern formation region 24C and the X-axis direction.

What is claimed is:

1. A pattern forming method of forming a pattern on a surface of an object by using a droplet discharge device that discharges a first droplet and a second droplet from nozzles, the method comprising:
    when coordinates on the object surface are represented by integers m and n, and two integers other than zero are represented by i and j, forming a bank pattern that borders a pattern formation region such that a range of a first projection image of the first droplet when a landable position with a coordinate (m, n) substantially coincides with the center of the first projection image and a range of a second projection image of the second droplet when a landable position with a coordinate (m+i, n+j) substantially coincides with the center of the second projection image fall within the pattern formation region on the surface of the object; and
    forming a pattern that covers the pattern formation region by discharging the first droplet to the landable position with the coordinate (m, n) and by discharging the second droplet to the landable position with the coordinate (m+i, n+j);
    wherein the distance between the landable position with the coordinate (m, n) and the landable position with the coordinate (m+i, n+j) is determined such that the first droplet and the second droplet flow into each other after the first and second droplets spread on the pattern formation region.

2. The pattern forming method according to claim 1, wherein the forming of the bank pattern that borders the pattern formation region includes forming the bank pattern such that two linear or curved pattern formation regions are obtained, and the two pattern formation regions are parallel to each other.

3. The pattern forming method according to claim 1, wherein the forming of the bank pattern that borders the pattern formation region includes forming the bank pattern such that two linear or curved pattern formation regions are obtained, and the two pattern formation regions are not parallel to each other.

4. The pattern forming method according to claim 3, wherein the two linear pattern formation regions are connected to each other, one of the two linear pattern formation regions is parallel to a first direction, the other of the two linear pattern formation regions forms an angle that is greater than 0° and smaller than 90° with respect to the first direction, and the forming of the pattern that covers the pattern formation region includes discharging a droplet with a first volume to the landable position in the one pattern formation region, and discharging a droplet with a second volume smaller than the first volume to the landable position in the other pattern formation region.

5. The pattern forming method according to claim 1, wherein the droplet discharge device is adapted to selectively discharge a plurality of droplets from the nozzles to a plurality of landable positions by relatively moving the nozzles in a first direction and a second direction that are different from each other, the plurality of landable positions constitutes a grid parallel to the first direction and the second direction, a first pitch between the plurality of landable positions along the first direction is determined on the basis of a relative moving speed of the nozzles in the first direction and a minimum discharge period corresponding to a material in a liquid phase, and a second pitch between the plurality of landable positions along the second direction is determined by a relative moving speed of the nozzles in the second direction.

6. The pattern forming method according to claim 1, wherein the material in a liquid phase is a conductive material.

7. A method of manufacturing an electronic apparatus including the pattern forming method according to claim 5.

8. A pattern forming method of forming a pattern on a surface of an object by using a droplet discharge device that discharges a first droplet and a second droplet from nozzles, the method comprising:

when coordinates on the object surface are represented by integers m and n, and two integers other than zero are represented by i and j, forming a lyophobic pattern that borders a pattern formation region such that a range of a first projection image of the first droplet when a landable position with a coordinate (m, n) substantially coincides with the center of the first projection image and a range of a second projection image of the second droplet when a landable position with a coordinate (m+i, n+j) substantially coincides with the center of the second projection image fall within the pattern formation region on the surface of the object; and forming a pattern that covers the pattern formation region by discharging the first droplet to the landable position with the coordinate (m, n) and by discharging the second droplet to the landable position with the coordinate (m+i, n+j);

wherein the distance between the landable position with the coordinate (m, n) and the landable position with the coordinate (m+i, n+j) is determined such that the first droplet and the second droplet flow into each other after the first and second droplets spread on the pattern formation region.

9. The pattern forming method according to claim 8, wherein the forming of the lyophobic pattern that borders the pattern formation region includes forming the lyophobic pattern such that two linear or curved pattern formation regions are obtained, and the two pattern formation regions are parallel to each other.

10. The pattern forming method according to claim 8, wherein the forming of the lyophobic pattern that borders the pattern formation region includes forming the lyophobic pattern such that two linear or curved pattern formation regions are obtained, and the two pattern formation regions are not parallel to each other.

11. The pattern forming method according to claim 10, wherein the two linear pattern formation regions are connected to each other, one of the two linear pattern formation regions is parallel to a first direction, the other of the two linear pattern formation regions forms an angle that is greater than 0° and smaller than 90° with respect to the first direction, and the forming of the pattern that covers the pattern formation region includes discharging a droplet with a first volume to the landable position in the one pattern formation region, and discharging a droplet with a second volume smaller than the first volume to the landable position in the other pattern formation region.

12. A method of manufacturing a substrate, the substrate including a pattern formation region to which a first droplet and a second droplet is imparted by using a droplet discharge device that relatively moves nozzles in a first direction and a second direction different from each other to discharges the first droplet and the second droplet from the nozzles, the method comprising:

when coordinates on a surface of the substrate are represented by integers m and n, and two integers other than zero are represented by i and j, forming a bank pattern that borders a pattern formation region such that a range of a first projection image of the first droplet when a position with a coordinate (m, n) substantially coincides with the center of the first projection image and a range of a second projection image of the second droplet when a position with a coordinate (m+i, n+j) substantially coincides with the center of the second projection image fall within the pattern formation region, wherein the distance between the position with the coordinate (m, n) and the position with the coordinate (m+i, n+j) is determined such that the first droplet and the second droplet flow into each other after the first and second droplets spread on the pattern formation region.

13. A method of manufacturing a substrate, the substrate including a pattern formation region to which a first droplet and a second droplet is imparted by using a droplet discharge device that relatively moves nozzles in a first direction and a second direction different from each other to discharges the first droplet and the second droplet from the nozzles, the method comprising:

when coordinates on a surface of the substrate are represented by integers m and n, and two integers other than zero are represented by i and j, forming a lyophobic pattern that borders a pattern formation region such that a range of a first projection image of the first droplet when a position with a coordinate (m, n) substantially coincides with the center of the first projection image and a range of a second projection image of the second droplet when a position with a coordinate (m+i, n+j) substantially coincides with the center of the second projection image fall within the pattern formation region, wherein the distance between the position with the coordinate (m, n) and the position with the coordinate (m+i, n+j) is determined such that the first droplet and the second droplet flow into each other after the first and second droplets spread on the pattern formation region.

* * * * *